(12) United States Patent
Mayer

(10) Patent No.: US 7,009,546 B2
(45) Date of Patent: Mar. 7, 2006

(54) CONTROL UNIT HAVING A SIGNAL CONVERTER

(75) Inventor: Werner Mayer, Fellbach (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 11/050,803

(22) Filed: Feb. 7, 2005

(65) Prior Publication Data

US 2005/0190093 A1    Sep. 1, 2005

(30) Foreign Application Priority Data

Feb. 6, 2004    (DE) .................. 10 2004 005 793

(51) Int. Cl.
*H03M 1/12* (2006.01)
(52) U.S. Cl. .................. 341/155; 341/165
(58) Field of Classification Search .......... 341/155
See application file for complete search history.

(56) References Cited

U.S. PATENT DOCUMENTS

| | | | |
|---|---|---|---|
| 6,188,340 B1 * | 2/2001 | Matsumoto et al. | 341/110 |
| 6,476,743 B1 * | 11/2002 | Brown et al. | 341/123 |
| 6,850,176 B1 * | 2/2005 | Laflaquiere et al. | 341/137 |
| 6,927,718 B1 * | 8/2005 | Koch | 341/143 |
| 2003/0090401 A1 | 5/2003 | Yoshizawa | |
| 2003/0132871 A1 * | 7/2003 | Laflaquiere et al. | 341/158 |

FOREIGN PATENT DOCUMENTS

DE    195 18 508 A1    5/1995
EP    1 300 951 A2    9/2002

* cited by examiner

*Primary Examiner*—Peguy JeanPierre
*Assistant Examiner*—Joseph Lauture
(74) *Attorney, Agent, or Firm*—Crowell & Moring LLP

(57) ABSTRACT

A control unit for a transportation device has a processing unit that is supplied with power by a first supply voltage and has a signal converter for converting input analog signals to digital signals. The signal converter has an analog converter stage for generating a modified signal from the analog signal and a digital converter stage for generating a digital signal from the modified signal. The analog converter stage has a signal integration stage connected to a signal amplitude comparator; and the digital converter stage has a scanning stage to whose output the analog-to-digital-converted digital signal is applied. The digital converter stage comprises configurable logic circuits provided on the chip of the processing unit; while the analog converter stage comprises components outside the processing unit. The analog converter stage is supplied with voltage by a second supply voltage different from the first supply voltage.

8 Claims, 3 Drawing Sheets

CONTROL UNIT HAVING A SIGNAL CONVERTER

BACKGROUND AND SUMMARY OF THE INVENTION

This application claims the priority of German patent document 10 2004 005 793.1, filed Feb. 6, 2004, the disclosure of which is expressly incorporated by reference herein.

The invention relates to a control unit for a transportion device having a processing unit, such as programmable logic or a microcomputer, that is supplied with power by means of a first supply voltage and has a signal converter for converting analog signals to digital signals. The signal converter includes an analog converter portion for generating a modified signal from the analog signal at the signal converter input, and a digital converter portion for generating a digital signal from the modified signal. The analog converter portion includes a signal integration stage, whose output signals are fed to a signal amplitude comparator, and the digital converter portion includes a scanning stage, to whose output the analog-to-digital-converted digital signal is applied.

Nowadays, control units in transportation devices (such as motor vehicles, utility vehicles and airplanes) often carry out control tasks by reading and processing sensor signals, and controlling actuators (such as electric motors or air bag triggering units) based on their control signals. The sensors frequently supply an analog measuring signal which is converted to a digital signal by an analog-to-digital converter, so that the microcomputer of the control unit can process the digital signal to generate control signals. In conventional control units, analog-to-digital converters for this purpose are provided separately with respect to the microcomputer or a programmable logic of the control unit.

Conventional control units for transport devices have microcomputers or a programmable logic that include, among other items, functional blocks of the central computer core, program and data memories, timer units, input/output interfaces and serial interfaces. Today's microcomputers, such as microprocessors or microcontrollers, are normally operated by means of a 5 V supply voltage. In order to achieve a higher complexity or clock frequency, the structures on the semiconductor chips must become increasingly smaller, which in turn decreases the distances, particularly the thickness of the insulation layers, between semiconductor structures that operate with different voltage potentials. Therefore, when the semiconductor material is the same, in smaller structures the supply voltage must also be reduced to avoid discharges through the insulation layers, and thus the destruction of the semiconductor. The supply voltage of the microcomputers is therefore reduced to below 5 V.

However, as a result, when the analog-to-digital signal converter is supplied with the lower supply voltage, the signal-to-noise ratio on the analog side of the signal converter becomes very small. For example, if the peripheral voltage supply is reduced to 3.3 V or 2.5 V, the signal-to-noise ratio and the signal level swing of the analog signals falls significantly; and the sensors with a 5 V supply voltage (which are common in transport devices) cannot be reliably detected by the microcomputer without additional signal matching.

To solve this problem, it has been attempted to supply an analog-to-digital signal converter provided independently of the microcomputer of the control unit with 5 V, while the microcomputer or the alternative programmable logic of the control unit is controlled by means of a lower supply voltage. This results in higher costs for the additional voltage supply for the analog-to-digital signal converter. It should be taken into account in this case that the supply voltage should only be subjected to low voltage fluctuations so that the digital signals can finally be processed in the microcomputer. If greater voltage fluctuations or voltage differences occur at the voltage levels between the signal converter and the microcomputer, falsifications of the computing results occur during the processing of the digital signals in the microcomputer.

European Patent Document EP 1 300 951 A1 discloses a so-called delta-sigma signal converter which is divided into an analog and a digital converter part. The analog converter part has an integrator, a buffer and, connected thereto, a digital flip-flop from whose inverting output another storage element is fed back to the input of the integrator. The signal is scanned by the flip-flop which operates at very high scanning frequencies. To avoid problems with electromagnetic compatibility, the flip-flop is integrated in the digital converter part, preferably on a semiconductor chip.

One object of the present invention is to provide a control unit with a programmable logic or a microcomputer with an improved signal converter so that, while the supply voltage for the semiconductor chip of the microcomputer or of the programmable logic is reduced, high signal separation is possible at the analog signal levels of the analog-to-digital converter.

This and other objects and advantages are achieved by the control unit according to the invention, in which the digital converter portion is implemented by configurable logic circuits provided on the chip of the programmable logic or of the microcomputer, while the analog converter portion is provided by components outside the programmable log or the microcomputer. The analog converter portion is supplied with voltage by a second supply voltage that deviates from the first supply voltage.

The control unit is preferably suitable for motor vehicles and utility vehicles for controlling assemblies, the engine, the clutch or the starter generator of the transport device, for example. For this purpose, sensors may be provided at the transmission, the brake or at the chassis, which transmit analog sensor data to the control unit. The control unit has either a microcomputer, such as a microcontroller or microprocessor, or a programmable logic, such as a field programmable gate array (FPGA). Because of the very high clock frequencies, the microcomputer or the programmable logic are controlled by a lower supply voltage than the peripheral components outside the microcomputer or the programmable logic.

For example, the computer core may be supplied with a voltage of 1 to 4 V, while the peripheral circuits of the microcomputer and external logic components are provided with a 5 V voltage supply. By dividing the signal converter into a digital converter portion and an analog converter portion, the analog converter portion being supplied with a higher supply voltage, signal levels which are as large as possible are created on the analog side, so that a larger signal-to-interference ratio becomes possible in the case of these signals. As a result, serviceable signals are still created even in the event of a high-interference vehicle environment, permitting an interference-free control operation by means of the control unit.

The present invention has the advantage that the control unit completely eliminates the need for a discrete analog-to-digital signal converter or a conventional analog-to-digital signal converter which can be integrated in the microcontroller. The digital converter portion of the signal converter according to the invention is assigned to the microcomputer or to the programmable logic. That is, the circuit becomes a component of the configurable or programmable circuit of the respective input/output pins of the microcomputer or of the programmable logic. The analog converter portion with the integrator is not integrated in the microcomputer on the programmable logic but, depending on the requirements, has a discrete construction or is constructed as an individual circuit outside the microcomputer. However, multi-channel analog-to-digital signal converters can also be constructed in that several analog converter portions are connected in parallel and in each case interact with the pertaining digital converter portion on the microcomputer.

The external analog converter portion of the transport device control unit has a signal adder on its input, which adds the analog signal to be converted and a feedback signal from the digital converter part. As a result, the control unit constructed without a separate analog-to-digital signal converter has almost no analog circuit parts. Only a voltage regulator and special sensor interfaces are required.

The digital converter portion integrated in the microcomputer or the programmable logic preferably has counters, registers, clock multipliers and filters. By virtue of the special digital circuit parts, such as counters, registers, clock multipliers or filters, which already exist in microcomputers or programmable logics, the analog-to-digital signal conversion provided according to the invention can be carried out largely without stressing the CPU of the microcomputer. The special circuit parts, of which several are usually present, are preferably configured or programmed for the digital converter portion according to the invention. As a result, it also becomes possible to define freely the number of channels of the signal converter by means of software or external additional analog wiring. Unused channels will then be available after a corresponding configuration, for example, for the frequency or period length measurement or for generating pulse duration modulated signals.

In the signal converter according to the invention, a feedback signal is preferably provided from the output of the scanning stage, and is, for example, digital-to-analog-converted. Such a feedback signal is then fed to the adder at the input of the signal converter. The digital converter portion has a digital filter which processes the digital signals at the output of the scanning stage. The digital signals with the high scanning frequency can also be converted simultaneously into parallel signals, so that, for example, a parallel 10 bit signal can be created at the output of the signal converter.

Preferably, the first supply voltage for the programmable logic or the microcomputer is lower than 5 V, and the second supply voltage is greater than the first supply voltage. (The first supply voltage can, for example, be in the range of from 2 to 5 V, while the supply voltage of the analog converter part is at 5 V.) As a result, the chips can be miniaturized further for the microcomputer or the programmable logic, and the reduced first supply voltage permits an increased clock frequency of the microcomputer. Supply voltages of the digital computer core can then be implemented, for example, at 2.5 V or 1.8 V or 1.1 V. As a result of the second supply voltage at an increased voltage level, the signal-to-noise ratio and the signal level swing of the analog signals is significantly lowered, and the control signals of the microcomputer are less distorted by electromagnetic compatibility interferences. A portion of the digital converter part is wired as a timed storage element. A flip-flop can, for example, be used as a timed storage element. On the input side, the flip-flop is connected with the output signal of a comparator, so that, during each clocking, the flip-flop scans the comparator output signal and brakes it into individual pulses.

The signal of the flip-flop, which is quantified in this manner, is checked for digital signal changes and the number of required signal pulses for the signal level change is also counted. When an integrator is provided (for example, in front of the comparator), it is detected on the basis of the required clock pulses to the signal change at the output of the flip-flop which analog voltage level is applied to the input of the integrator. The corresponding digital signal will then in each case be present at the output of the digital filter connected on the output side. In this case, a corresponding signal coding can also take place here, so that the microcomputer can process the digital signal corresponding to its customary binary code. The digital filter is preferably implemented on the chip of the programmable logic or of the microcomputer.

The control unit according to the invention can be constructed with a separate analog-to-digital signal converter, which is programmed or configured by means of the circuit parts already existing on the microcomputer (such as counters, coding elements, filter components and logic circuits). As a result, the control unit largely requires no additional analog circuit parts which must be connected with the microcomputer via interfaces. A significantly higher integration or a further miniaturization on a single chip of the microcomputer or of the programmable logic therefore becomes possible; sensor signals are transmitted in a digital form from the sensor to the microcomputer. For this purpose, for the signal processing, the interface component present in the microcomputer or the programmable logic is used to convert the digital signals to the digital processing code of the control unit.

Other objects, advantages and novel features of the present invention will become apparent from the following detailed description of the invention when considered in conjunction with the accompanying drawings.

DETAILED DESCRIPTION OF THE DRAWINGS

Figure 1:
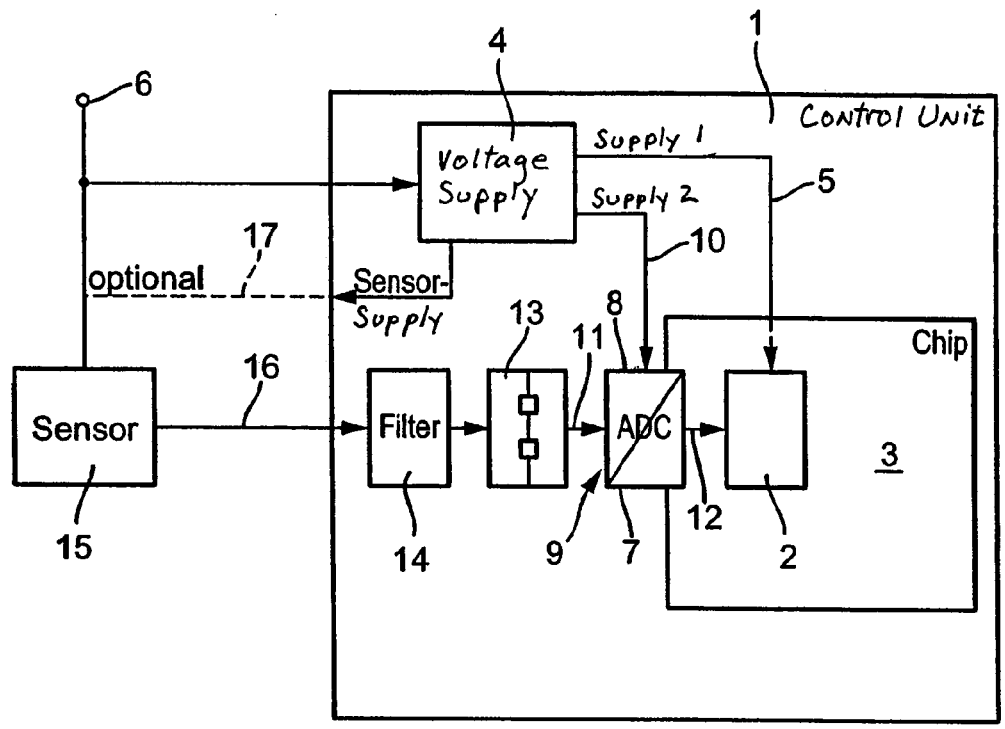
FIG. 1 is a schematic view of the control unit according to the invention with a programmable logic and an analog sensor coupled to the interface of the control unit.

The control unit has a semiconductor chip 3 with a programmable logic 2 that consists of many individual storage elements mutually connected in an electrically conductive manner by way of wiring lines. A control logic permits variation of the connection of the different storage cells with one another. In this manner, by means of the programmable storage cells, logic circuits, such as flip-flops, and therefrom logic gates or computer chips, can be simulated.

The field programmable gate arrays (FPGAs) are also part of the programmable logic, and can simulate interface chips or microcomputers 3 by reprogramming the connection lines. By way of a hardware description language, information concerning the wiring of the individual storage cells can be stored ahead of time in the form of digital data, and can be downloaded on the field programmable gate array (FPGA), so that the wiring is carried out automatically and the provided logic chip is thereby simulated.

The programmable logic 2 is supplied by a voltage supply chip 4 with a first supply voltage 5, preferably between 1 V and 5 V. The voltage level of the supply voltage 5 is to be kept low in order to minimize the power consumption of the programmable logic 2. The voltage supply component 4, in turn, obtains its supply voltage from the battery voltage 6 of the transport device. A digital converter stage 7 of the signal converter 9 is also integrated on the chip 3 with the programmable logic 2, and is supplied with the first supply voltage 5. The signal converter 9 also has a second, (analog) converter stage 8 which is supplied with a second supply voltage 10 from the voltage supply component 4. The supply voltage 10 is greater than the first supply voltage 5, so that the analog signal levels at the signal converter input 11 become larger than the digital signal levels at the signal converter output 12.

A voltage divider 13 and a filter 14 are provided in the control unit 1, in front of the signal converter 9 in the signal flow. The analog voltage signal 16 at the input of the control unit 1 originating from an analog sensor 15 is prefiltered by the filter 14 with respect to interfering signals (for example, electromagnetic signals), and the thus generated signal is fed to the voltage divider 13 in order to provide the corresponding analog signal voltage level at the input of the signal converter 9. The sensor 15 can optionally be supplied by the voltage supply component 4 with a third supply voltage 17. The sensor 14 may, for example, be a temperature sensor or a potentiometric path or angle sensor or a voltage measuring sensor. The sensor 15 can be provided as an analog sensor by way of the signal converter 9 at the control unit 1 for the engine timing.

The signal converter 9 according to the invention makes it unnecessary to provide a signal converter separate from the chip 3. The digital converter stage 7 is converted by means of the programmable logic 2 of the control unit 1. The analog converter stage 8 is converted by an external wiring of the chip 3 with separate components.

Sensors with a separate digital signal output can also be connected, in which case their signals, while bypassing the signal converter 9 of the programmable logic 2, can be provided directly at its input. As a result, relative to the signal conversion path and the signal processing path, the control unit 1 requires almost no analog circuit parts, making it possible to achieve a higher integration density or miniaturization. The actual signal processing can be performed in the programmable logic 2 or the microcomputer itself, the sensors 15 can be supplied with a voltage supply 17 from the voltage supply component 4 of the control unit 1.

Figure 2:
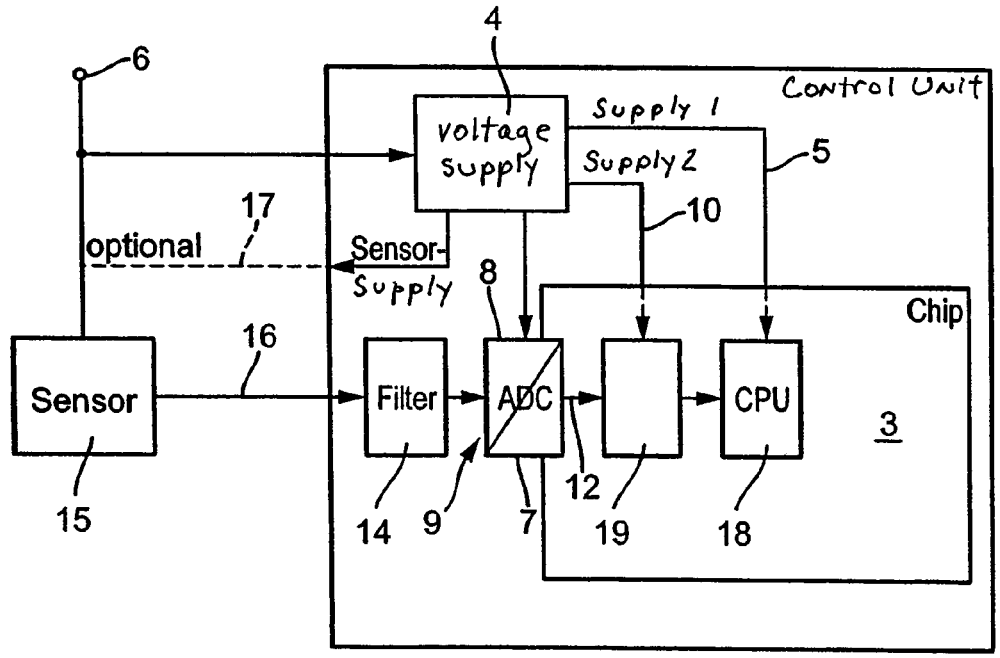
FIG. 2 is a schematic view of another embodiment of the control unit having a microcomputer and the signal converter according to the present invention.

FIG. 2 illustrates another embodiment of the control unit 1 having the signal converter 9 according to the invention. Instead of a programmable logic 2, a classic microcontroller with a computer core (CPU) 18 is provided here. The digital converter stage 7 is again converted on the chip 3 of the microcontroller 18. For this purpose, programmable logic gates, timer circuits or modulation circuits provided already in the interface area of the microcontroller 18 can be used, which are correspondingly implemented by means of software or configuration data.

Between the signal converter 9 and the computer core 18, a universal counter and filter unit 19 is also provided. The latter converts, for example, the output signals of the signal converter 9 from a serial digital signal to a parallel digital signal that can be processed in the microcomputer core 18. Furthermore, the signal length/size of the digital signal or the coding of the digital signal can also be changed. Finally, addressing can also be performed in the counter and filter unit 19 which can be processed by the computer core 18. A significant difference with respect to the preceding embodiment consists of the fact that, instead of a programmable logic 2 in the control unit 1, a microcontroller 18 is provided which provides and calculates the control data, and that the signal converter 9 with its digital converter stage 7 is provided on the chip 3 of the microcontroller 18.

Figure 3:
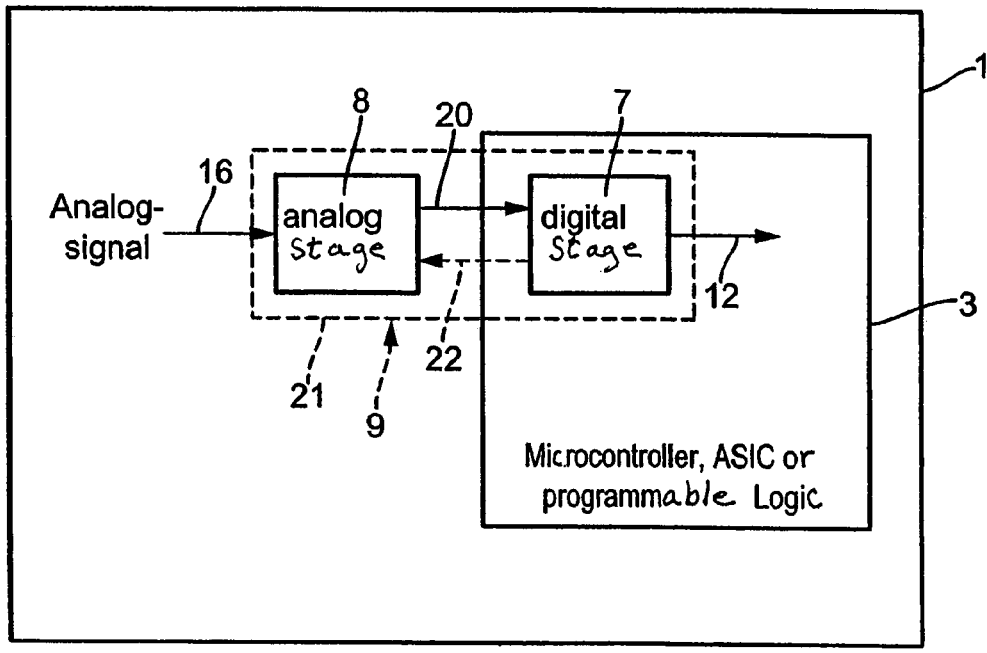
FIG. 3 is a schematic representation of the two-part signal converter having an analog converter stage and a digital converter stage.

FIG. 3 is a schematic view of the control unit 1 with the signal converter 9 according to the invention. The analog signal 16 is fed to the signal converter input of the analog converter stage 8 and is converted to a modified signal 20. The modified signal 20 is fed to the digital converter stage 7 of the signal converter 9 to produce a digital signal at the signal converter output 12. This digital output signal is then, in turn, fed to the microcomputer 18, the user-specific control chip (ASIC) or the programmable logic 2 of the control unit 1. The reverse signal path can be provided in the form of a digital-to-analog converter 21 so that, starting from the microcomputer 18 on the chip 3, the digital signal is converted by way of the digital converter stage 7 to a modified signal 22 and is provided as such to the analog converter stage of the digital-to-analog converter 21. In this manner, actuators can also be supplied with an analog control signal of the control unit 1.

Figure 4:
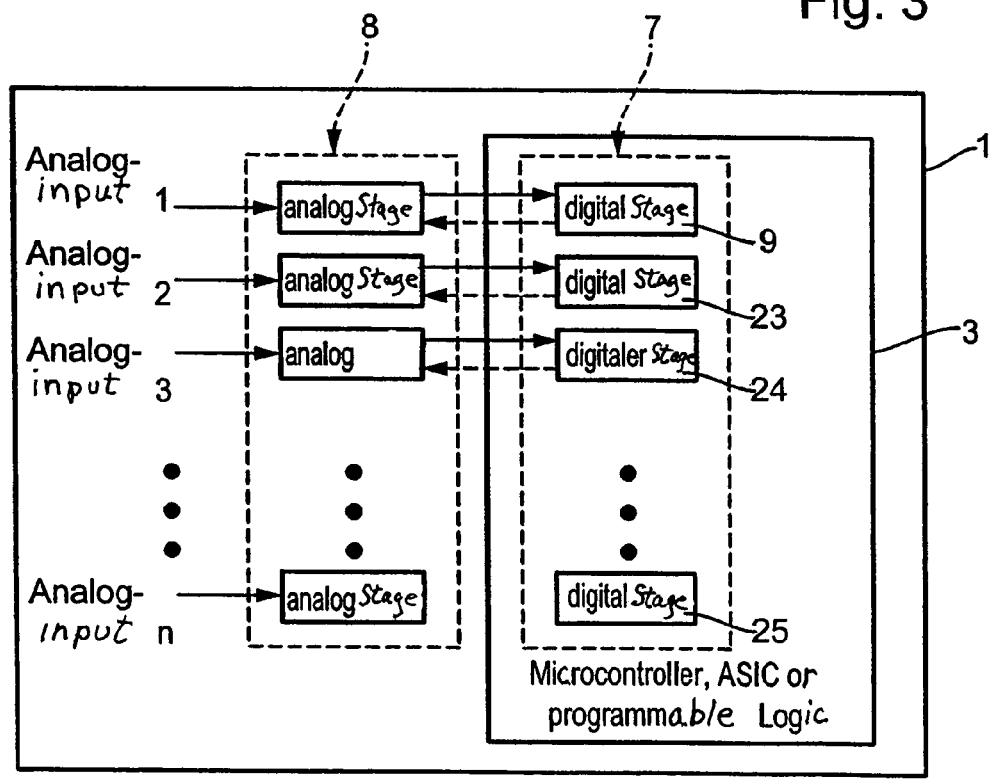
FIG. 4 is a schematic representation of several signal converters connected in parallel according to the present invention.

FIG. 4 shows that parallel-connected signal converters 9, 23, 24, 25 can in each case be provided with the digital converter stages 7 and the analog converter stages 8. For this purpose, a corresponding number of parallel digital logic circuits are programmed on the microcontroller 18, without the requiring that a separate signal converter component outside the microcomputer chip 3. The analog converter parts 8 are in each case produced by a discrete wiring by means of analog components or by several analog circuit parts integrated in a housing at the interface of the chip 3.

Figure 5:
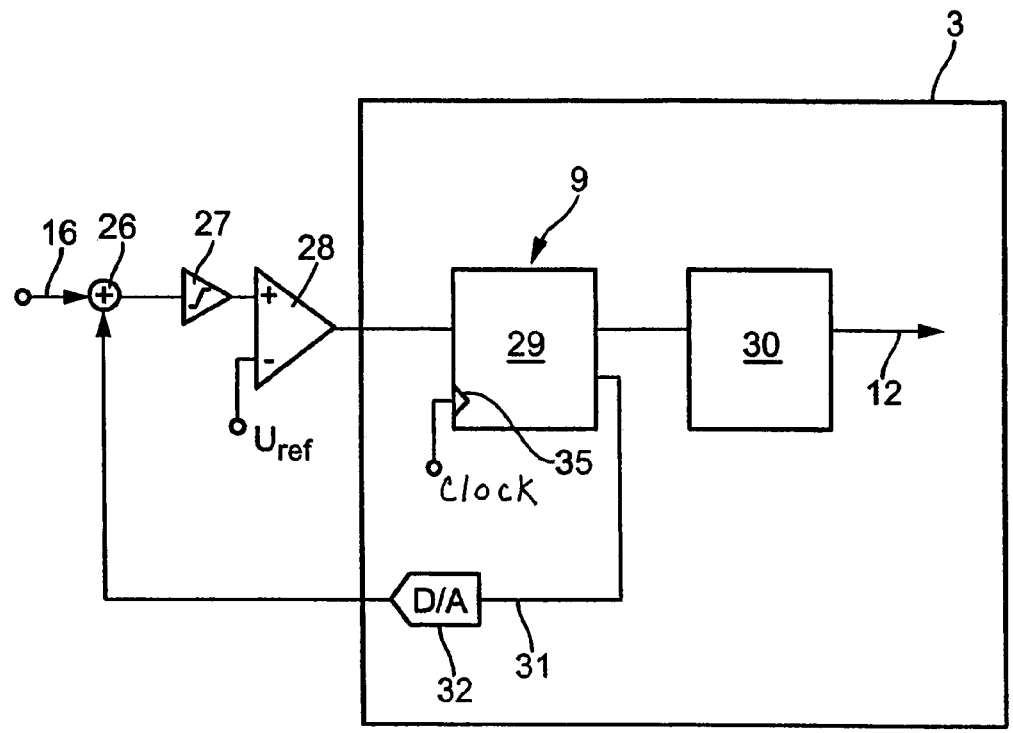
FIG. 5 is a connection diagram of the signal converter of the invention according to an embodiment of the invention.

FIG. 5 shows a first embodiment of the signal converter 9. At the signal converter input 16, the analog signal is fed to an adder 26, where it is combined with a feedback signal of the feedback loop 31. The summed-up analog signal is fed to an integrator 27 whose output is, in turn, connected with a comparator 28 which compares the incoming signal with a reference voltage Uref. In the signal flow behind the comparator 28, a scanning stage 29 is used which scans the incoming signal with a system clock sequence 35. The resulting digitized signal is fed to a digital filter 30 which finally generates the digital output signal 12 at the converter output. In the feedback loop 31, a digital-to-analog converter 32 is provided which returns the digital signal behind the scanning stage 29 to the summation point 26.

The circuit illustrated in FIG. 5 operates as follows. An analog input signal 16 is provided at the signal converter 9 and is integrated by the integrator 27 until the comparator switches over because the integration signal reaches the comparison voltage $U_{ref}$. At the output of the comparator 28, an edge change takes place in this case; for example, the output signal of the comparator 28 switches from the low level to the high level. In the scanning stage 29, the signals available at the comparator output 28 are then disassembled at the scanning rate at the input 35 into individual signal sections, and the scanning points in time can be counted which were necessary until an edge change was produced at the comparator 28 by the incoming analog signal. The number of scanning points in time which were required until the edge change at the comparator 28 are a measurement of the signal level 16 applied to the input of the signal converter 9. The feedback loop 31, prevents the integrator from running into the lower or upper limit, so that a stable operation of the signal converter becomes possible. The digital filter 30 filters out high-frequency interfering signals, so that an optimal digitized signal 12 for the microcontroller 18 can be made available at the output of the signal converter 9.

Figure 6:
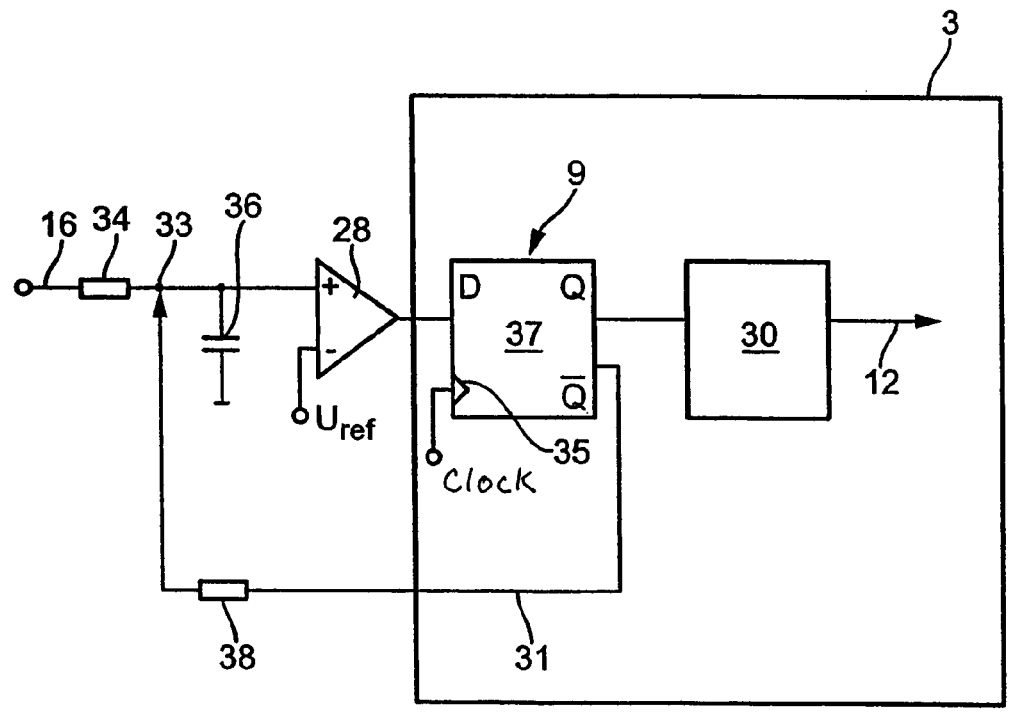
FIG. 6 is a connection diagram of the signal converter of the invention according to another embodiment.

FIG. 6 illustrates an embodiment of the signal converter 9, showing it in its simplest form. The adder 33 is illustrated by a summation point with voltage divider resistors 34 and 38 connected thereto. By means of the voltage divider resistors 34 and 38, the ratio of the feedback in the feedback path 31 to the input signal 16 can be adjusted. In the simplest case, a discrete capacitor component 36 at the input of the chip 3 can be provided as the integrator. Behind the signal input, the comparator 28 is then provided on the chip 3, and the reference voltage $U_{ref}$ is provided on the chip 3 by means of the microcomputer. In the simplest case, a flip-flop 37 is provided as the scanning stage, which flip-flop 37 can be programmed on the chip 3 by a programmable logic 2 or by an interface wiring of the microcontroller 18. At the output of the flip-flop Q, high or low levels are then emitted to the digital filter 30. The feedback loop is then joined to the negating input $\overline{Q}$.

The present invention is characterized by the following points:

By means of the (engine) control unit without an analog-to-digital converter and thus essentially without analog circuit parts (other than a voltage regulator and special sensor interfaces), a higher integration or a further miniaturization becomes possible.

Digital sensor signal interfaces, which operate in a wide input range and possibly may have programmable switching levels and hystereses. The signal processing can be integrated in the microcomputer (microcontroller, microprocessor) or in the programmable logic (PAL, FPGA, CPLD, and others).

Supplying the sensors with a digital signal interface by means of the on-board voltage simplifies the vehicle cabling.

Sensors no longer have to be supplied by the control unit (fewer connector pins are required at the control unit), but can be connected directly to the on-board voltage. A ratiometric interrelationship between the sensor supply, the sensor signal and the analog-to-digital converter reference or the analog-to-digital converter supply is no longer necessary. The (engine) control unit has only voltage regulators for the internally required (computer) supplies. Monitoring of the sensor supply by the microcontroller can also be eliminated.

The analog circuit stage may have a discrete construction or may be constructed to be integrated as an individual circuit in a housing. If several channels are required, several analog circuit stages can be accommodated in a housing.

To increase precision, the reference signal normally required for the comparator can be fed externally (for example, by way of a reference diode or a reference source), and the capacitor normally required for the integrator can be connected externally (for example, by way of a reference diode or a reference source).

The digital stage is implemented in the microcomputer (microcontroller, microprocessor) or in the programmable logic (PAL, FPGA, CPLD, and others).

When several analog and digital circuit stages are provided, several analog input signals can be detected in parallel (that is, isochronously), which is advantageous for a regulation-related processing.

At correspondingly high clock frequencies, significantly higher signal resolution can be achieved in comparison to conventional analog-to-digital converters according to the successive approximation method which reach resolutions of maximally 12 bit as an integrated result in microcontrollers.

The multiple special digital circuit parts for the digital part of the analog-to-digital converter which are usually present, are assigned to the configurable or programmable timer unit of the microcontroller.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A control unit for a transportation device having a processing unit that is supplied with power by a first supply voltage and has a signal converter for converting analog signals to digital signals; the signal converter having an analog converter stage for generating a modified signal from an analog signal which is present at the signal converter input, and a digital converter stage for generating a digital signal from the modified signal; the analog converter stage having a signal integration unit whose output signals are fed to a signal amplitude comparator; and the digital converter stage having a scanning device to whose output the analog-to-digital-converted digital signal is applied; wherein, the digital converter stage comprises configurable logic circuits provided on a chip of the processing unit;

the analog converter stage comprises components outside the processing unit; and the analog converter stage is supplied with voltage by a second supply voltage having a voltage that differs from the first supply voltage.

2. The control unit according to claim 1, wherein the analog converter stage has a signal adder at its input, which signal adder adds the analog signal and a feedback signal from the digital converter stage.

3. The control unit according to claim 1, wherein the feedback signal is fed back from an output of the scanning device and is digital-to-analog-converted.

4. The control unit according to claim 1, wherein the digital converter stage has a digital filter that processes digital signals at an output of the scanning stage.

5. The control unit according to claim 1, wherein:

the first supply voltage for the processing unit is a voltage of less than 5 V; and the second supply voltage is greater than the first supply voltage.

6. The control unit according to claim 1, wherein:

a part of the signal converter is wired as a timed storage element whose clock rate has a higher frequency than a processing clock rate of the processing unit; and the timed storage element is provided as the scanning device of the signal converter.

7. The control unit according to claim 1, wherein the processing unit has a programmable or configurable interface area in which digital filters, a sequence control of the signal converter or counters are implemented on the chip.

8. A data processing device comprising:
first and second voltage supplies providing first and second voltages that differ from each other;
a signal converter for converting analog input signals to digital signals, said signal converter including an analog converter stage for generating modified signals in response to said input signals, and a digital converter stage for generating digital signals in response to the modified signals; wherein,
the analog converter stage has a signal integration unit whose output signals are fed to a signal amplitude comparator;
the digital converter stage has a scanning device to whose output the analog-to-digital converted signal is applied;
the digital stage comprises configurable logic circuits on a chip of the processing device;
the analog converter stage comprises components outside the processing device;
the first voltage supply provides power to the processing device; and
the second voltage supply provides power to the analog converter stage.

* * * * *